(12) United States Patent
Ghyselen

(10) Patent No.: US 6,958,284 B2
(45) Date of Patent: Oct. 25, 2005

(54) METHOD OF SMOOTHING THE OUTLINE OF A USEFUL LAYER OF MATERIAL TRANSFERRED ONTO A SUPPORT SUBSTRATE

(75) Inventor: Bruno Ghyselen, Seyssinet-Pariset (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 104 days.

(21) Appl. No.: 10/617,521

(22) Filed: Jul. 11, 2003

(65) Prior Publication Data

US 2004/0121557 A1  Jun. 24, 2004

Related U.S. Application Data

(60) Provisional application No. 60/461,524, filed on Apr. 9, 2003.

(30) Foreign Application Priority Data

Jul. 17, 2002  (FR) .................................. 02 09022

(51) Int. Cl.⁷ .......................... H01L 21/30; H01L 21/46
(52) U.S. Cl. ...................... 438/458; 438/455; 438/459
(58) Field of Search .............................. 438/455, 458, 438/459; 257/E21.568

(56) References Cited

U.S. PATENT DOCUMENTS

| | | | |
|---|---|---|---|
| 5,152,857 A | 10/1992 | Ito et al. ..................... 156/153 |
| 5,597,410 A | 1/1997 | Yen ............................. 117/84 |
| 6,093,623 A | 7/2000 | Forbes ........................ 438/455 |
| 6,309,950 B1 | 10/2001 | Forbes ........................ 438/455 |
| 6,417,108 B1 * | 7/2002 | Akino et al. ................. 438/690 |
| 6,538,330 B1 | 3/2003 | Forbes ........................ 257/777 |
| 6,566,235 B2 * | 5/2003 | Nishida et al. .............. 438/458 |
| 2001/0055854 A1 | 12/2001 | Nishida et al. .............. 438/455 |
| 2003/0008478 A1 * | 1/2003 | Abe et al. .................... 438/459 |

FOREIGN PATENT DOCUMENTS

| EP | 0451993 | 10/1991 |
|---|---|---|
| EP | 1059663 A1 | 12/2000 |
| EP | 1 189 266 A1 | 3/2002 |
| WO | WO 01/73831 | * 10/2001 .......... H01L 21/304 |

* cited by examiner

Primary Examiner—Erik Kielin
Assistant Examiner—Heather A. Doty
(74) Attorney, Agent, or Firm—Winston & Strawn LLP

(57) ABSTRACT

A method of providing a regular outline in a useful layer of material that is transferred from a source substrate onto a support substrate during the fabrication of a composite substrate for subsequent use in electronics, optics, or opto-electronics. The technique includes providing a shoulder on a front face of one of the source or support substrates about its periphery. The shoulder defines an inner projecting zone that has a top face, a sidewall and a regular outline. Next, the method includes molecularly bonding the top face of the projecting zone to a receiving face of the other of the source or support substrates, and removing a portion of the projecting zone from the source substrate to provide the useful layer having the regular outline on the support substrate.

19 Claims, 4 Drawing Sheets

METHOD OF SMOOTHING THE OUTLINE OF A USEFUL LAYER OF MATERIAL TRANSFERRED ONTO A SUPPORT SUBSTRATE

This application claims the benefit of provisional application 60/461,524 filed Apr. 9, 2003.

BACKGROUND ART

The present invention relates to a method of smoothing the outer outline of a useful layer of a semiconductor material transferred onto a support during the fabrication of substrates for electronics, optics, or optoelectronics.

Currently, all substrates fabricated using techniques combining bonding by molecular bonding (known as "wafer bonding") and transferring a useful layer onto a support have a zone known as a "peripheral ring".

The ring is a zone located at the periphery of the support and for which transfer of the useful layer has not occurred, or when transfer has occurred, the ring is a zone in which the useful layer has been transferred partially, or has disappeared during subsequent treatment, due to its poor bonding to the support.

Accompanying FIGS. 1 and 2 are respective cross sectional and plan views of a substrate that is known to the skilled person under the acronym "SOI" meaning "silicon on insulator".

FIG. 1 shows a support 1 of silicon onto which a composite layer 2 comprising a layer of silicon oxide 21 surmounted by a layer of silicon 22 has been transferred by molecular bonding.

The term "ring" 3 defines a substantially annular zone of support 1 onto which the composite layer 2 has either not been transferred or has been transferred poorly during transfer of the layer. The plan view (see FIG. 2) shows that the ring 3 varies in width, i.e., the lateral vertical side 200 of the composite layer 2 is irregular or jagged.

It should be noted that FIGS. 1 and 2 and the remaining figures are not drawn to scale both as regards to the thickness of the different layers and of the support and as regards the width of the ring.

The ring phenomenon occurs with other substrates, for example those known under the acronym "SICOI" meaning "silicon carbide on insulator" or under the acronym "SOQ" meaning "silicon on quartz". Other multi-layer substrates such as those comprising gallium arsenide on silicon (AsGa/Si) also exhibit that ring.

Independently of the diameter of support 1, which can vary, for example, from 2 inches (50 millimeters (mm)) for silicon carbide to 12 inches (300 mm) for certain silicon substrates, the ring 3 is regularly a few millimeters in width. Further, the width can vary, i.e., it can be 1 mm on one side of the substrate and can reach 4 mm on the other side, for example.

The appearance of the ring during layer transfer has a variety of origins, as discussed below. Particular mention can be made of the existence of chamfers on the substrates used, variations in bonding energy, the bonding techniques employed, and finally certain aggressive steps in substrate fabrication methods.

In order to explain the appearance of the ring, reference is made to the accompanying FIG. 3 which is a diagrammatic cross section of a portion of the sides of two substrates bonded together by molecular bonding. A source substrate 4 from which the future useful layer is to be cut, and a support substrate 5 intended to receive the useful layer are shown. This figure illustrates the prior art.

In the remainder of the description and drawings, the substrates are assumed to be circular in shape as this is the shape encountered most frequently. However, they can have other shapes.

The source substrate 4 has two opposite faces that are parallel; in FIG. 3 reference numeral 400 designates a "front" one of the faces. The front face 400 is intended for bonding onto the support 5. The source substrate 4 has a side 41 which is perpendicular to the plane of the front face 400.

Further, the substrate 4 has undergone treatment that forms a zone of weakness 42 that defines two portions, a rear portion and a useful layer 43 intended for subsequent transfer to the support 5.

Throughout the remainder of the description and claims, the expression "useful layer" designates a transferred layer of thickness that depends on whether it is obtained, for example, by a method of implanting atomic species or by abrasive polishing and/or chemical etching as is described below.

Currently, the substrates used both as the source substrate and as the support substrate are commercially available substrates satisfying standardized requirements (for example SEMI standards for a silicon substrate). These requirements are mainly concerned with ensuring that the substrates can be accepted by the equipment of as wide a range of users as possible.

According to those standards, at the intersection between the side 41 and the front face 400, the substrate 4 has an annular primary chamfer 44 or primary drop making a large angle $\alpha$ (close to 45°) with the plane of the front face 400 and more precisely with the rigorously flat central zone, as will be explained below. The primary chamfer 44 extends over a width L in the radial direction. The width L varies from 100 micrometers ($\mu$m) to 500 $\mu$m depending on the different substrates. The primary chamfer 44 is intended to limit the risk of mechanical rupture and notching of the source substrate 4.

In a similar manner to that just described for the source substrate 4, the support substrate 5 has a front face 500, a side 51 and a primary chamfer 54.

When substrates 4 and 5 are bonded to each other, bonding does not occur at chamfers 44 and 54 because of the magnitude of angle $\alpha$. The width of the ring can thus be expected to correspond to the width L of the primary chamfers 44 and 54. It has been shown, however, that it is even wider in practice.

It has been observed that the front face 400 of substrate 4 actually has two zones, namely a first rigorously flat zone 40 located substantially at the center of the substrate 4 and hereinafter termed the "flat central zone" and a second zone 45 surrounding the first zone.

The second zone 45 is a secondary annular chamfer or secondary drop forming an angle $\beta$ with the plane of the central zone 40. This angle $\beta$ is very small, generally less than 1°, so the secondary chamfer 45 actually constitutes a slight deviation from the plane of the central zone 40. The secondary chamfer 45 extends between the flat zone 40 and the primary chamfer 44.

Throughout the remainder of the description and claims, the expression "flat" means a flatness that is suitable for bonding, and the expression "central zone" designates a zone located substantially at the center of the front face of the substrate but which can, however, be located slightly excentrically on the face.

It should be noted that FIG. 3 and the following figures are only diagrammatic in nature and the magnitude of angle β has been considerably exaggerated in the figures for clarification purposes.

More precisely, the secondary chamfer 45 constitutes a drop that is less sharp than the primary chamfer 44 and which appears during the various substrate shaping steps (lapping, polishing, chemical etching). These steps producing an etching and material-removal effect that is greater on the substrate side. The secondary chamfer 45 is not subject to standards. Its width L' taken in a radial direction varies from about 500 μm to 3000 μm. The secondary chamfer 45 is a poorly defined zone of dimensions that are neither controlled or completely reproducible from one substrate to another. Further, the value of angle β also fluctuates, and so secondary chamfer 45 is not flat as shown diagrammatically in FIG. 3 but can be domed or irregular in places.

As a result, in reality (and in contrast to the diagrammatic representation of the figures), the side of the source substrate 4 is not formed by a plurality of beveled slopes but has a somewhat rounded shape, i.e., without edges between the secondary chamfer 45 and the primary chamfer 44 or between the primary chamfer and the side 41.

In a manner similar to that just described for the source substrate 4, the support substrate 5 has a flat central zone 50 and a substantially annular secondary chamfer 55. The annular secondary chamfer 55 has the same irregularities as the secondary chamfer 45.

Molecular bonding is a technique that cannot tolerate non-planar surfaces. Thus, the existence of the secondary chamfers 45, 55 results in poor bonding and layer transfer in that zone, resulting in the appearance of a peripheral ring.

A second reason for the appearance of the ring is that in general, the bonding energy between two facing faces reduces on moving from the center to the side of a substrate with the degree of bonding varying. In other words, the bonding energy is always lower at the periphery of the substrates.

The bonding energy also fluctuates as a function of parameters such as roughness, flatness and the chemical nature of the surfaces in contact, the presence of particles, etc. The parameters can also vary in a less controlled manner at the sides of the substrates.

Further, the bonding energy also depends on the deformation force on the source substrate and on the support substrate when they are pressed against each other. When bonding with bond initiation on one side, it is observed that the bonding energy is lower over the final portion of the bonding wave than over the initial portion or the central portion. As a result, in the final bonding zone, the ring is often more irregular and/or wider and/or more fragile.

Finally, a third possible cause for formation of the ring is the use of certain aggressive steps taken during the substrate fabrication methods.

Methods of fabricating substrates known under the acronym BESOI (bond and etchback silicon on insulator) bond a source substrate onto a support substrate, at least one of the faces of the source substrate being coated with a layer of oxide. The exposed surface of the source substrate then undergoes an abrasive polishing and/or chemical attack etching treatment followed by polishing until the source substrate becomes a useful layer.

In that type of method involving chemical attack (with the risk of partial delamination of the bonding interface), oxidation affecting the lateral and frontal portions of the source substrate, and mechanical abrasive polishing forces, both tend to enlarge the ring.

Similarly, in methods involving detachment of the layer by fracture along a zone of weakness, it has been observed that around the sides, detachment tends to occur at the bonding interface and not at the zone of weakness, resulting in the formation of an annular ring with a large surface area.

Referring again to FIG. 3, in the particular case of the zone of weakness 42 being formed by hydrogen implantation, it has been shown that, during subsequent treatment to detach the useful layer 43 from the remainder of the source substrate 4, expansion of hydrogen bubbles exerts a substantially perpendicular force on the plane of the secondary chamfer 45. In that zone, the force is not compensated by the existence of a surface that is in direct contact with and against which the secondary chamfer can press, since the secondary chamfer 55 is spaced from the secondary chamfer 45 by an angle 2β. Thus, bubbles are formed at the surface of the secondary chamfer 45 and those bubbles further reduce the bonding force between the secondary chamfers 45 and 55.

A number of disadvantages are associated with the existence of the peripheral ring.

First, the side of the transferred useful layer defining the ring is fragile and can crumble away during the treatments to which the final substrate is subjected. In addition to the disappearance of precious millimeters of useful layer during the component fabrication, crumbling of the layer produces particles that are a source of impurities that severely affects the fabrication yields of circuits formed from the components. By way of example, a particle with a diameter on the order of 0.1 μm is sufficient to destroy a 0.25 μm circuit.

Finally, the ring is irregular, as explained above, and its width can vary from about 1 mm to 4 mm from one side of the substrate to the other, which causes problems concerning reproducing the different steps in an industrial process when such a substrate is used in a production facility.

A goal of the invention is to overcome the disadvantages described above and in particular to render smooth and regular the side face or rim of the useful layer transferred onto a support during a layer transfer method.

SUMMARY OF THE INVENTION

The invention is directed to a method of providing a regular outline in a useful layer of material that is transferred from a source substrate onto a support substrate during the fabrication of a composite substrate for subsequent use in electronics, optics, or optoelectronics. The method includes providing a shoulder on a front face of one of the source or support substrates about its periphery, wherein the shoulder defines an inner projecting zone that has a top face, a sidewall and a regular outline. The technique also includes molecularly bonding the top face of the projecting zone to a receiving face of the other of the source or support substrates, and removing a portion of the source substrate to provide the useful layer having the regular outline on the support substrate.

The method may include one or more of the following features. The shoulder may be provided on the support substrate and the top face of the projecting zone may be molecularly bonded to the receiving face of the source substrate. The shoulder may be provided on the front face of the source substrate, the shoulder including the useful layer that is to be transferred, and the top face of the projecting zone may be molecularly bonded to the receiving face of the support substrate. The shoulder may be provided by machining or etching the periphery of the front face of the substrate. The receiving face may be bordered by a primary chamfer zone, a secondary chamfer zone, and a central zone having a flatness suitable for facilitating molecular bonding. The outline of the top face of the projection zone may have a periphery that is smaller than the inner periphery of the secondary chamfer zone so that, when bonded to the receiving face, the top face does not contact the secondary chamfer zone. The sidewall of the projecting zone may be substantially perpendicular to the top face. The method may further include, prior to the bonding step, forming a zone of weakness within the source substrate. The useful layer may extend between the zone of weakness and the face of the source substrate, and after the bonding step, the method may further include detaching the useful layer from the remainder of the source substrate along the zone of weakness. The useful layer may be detached by at least one of applying stresses of mechanical or electrical origin, supplying thermal energy, or chemical etching. The zone of weakness may be formed by atomic species implantation or by a porous layer. The shoulder may be provided on the front face of the source substrate prior to forming the zone of weakness. The height of the projecting zone of the source substrate may be greater than or equal to the thickness of the useful layer. The height of the projecting zone may be 10 nm to 200 nm or more. The method may further include polishing an exposed face of useful layer after detachment from the source substrate. The support substrate may be produced from silicon; silicon carbide; gallium arsenide; indium phosphide; or germanium. The source substrate may be formed from a semiconductor material. The semiconductor material of the source substrate may be silicon; germanium; compounds of silicon and germanium; silicon carbide; gallium nitride; gallium arsenide; or indium phosphide. At least one of the molecularly bonded faces may include a layer of an insulating material. The molecularly bonded face of the source substrate may include a layer of an insulating material.

BRIEF DESCRIPTION OF THE DRAWING FIGURES

Other characteristics and advantages of the invention become apparent from the following description of a preferred implementation of the invention. This description is made with reference to the accompanying drawings in which.

Figure 4:
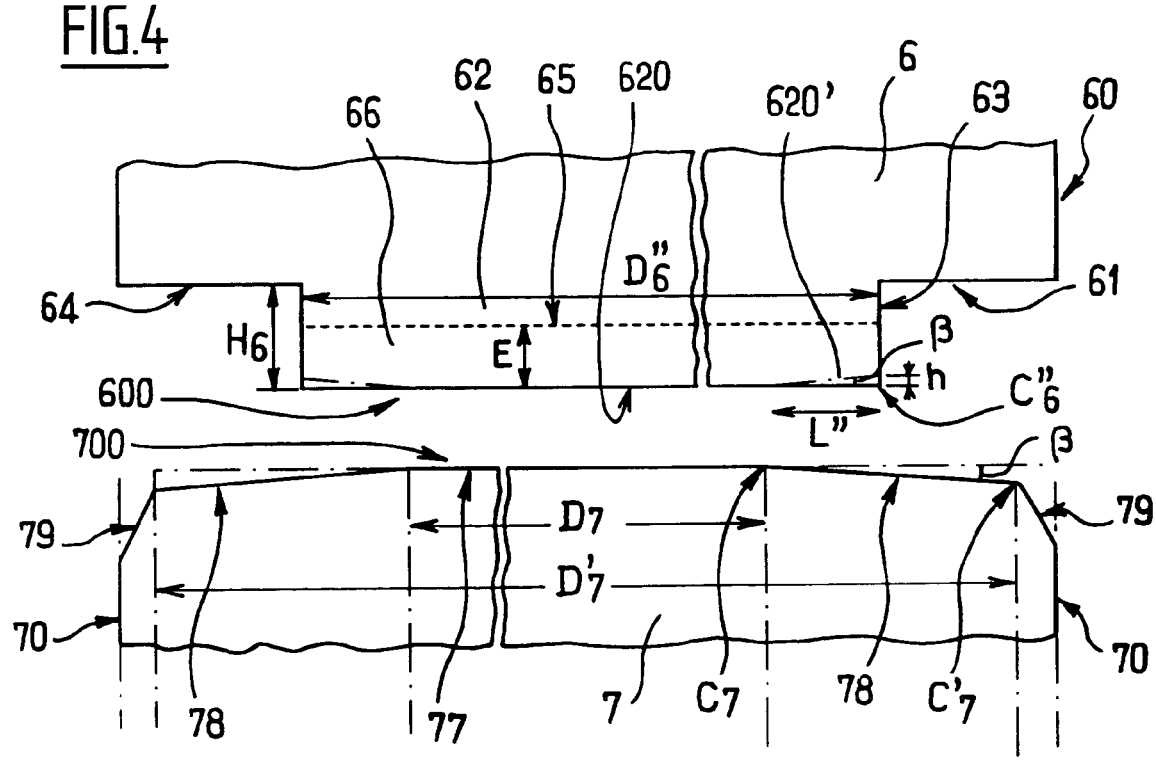
Figure 5:
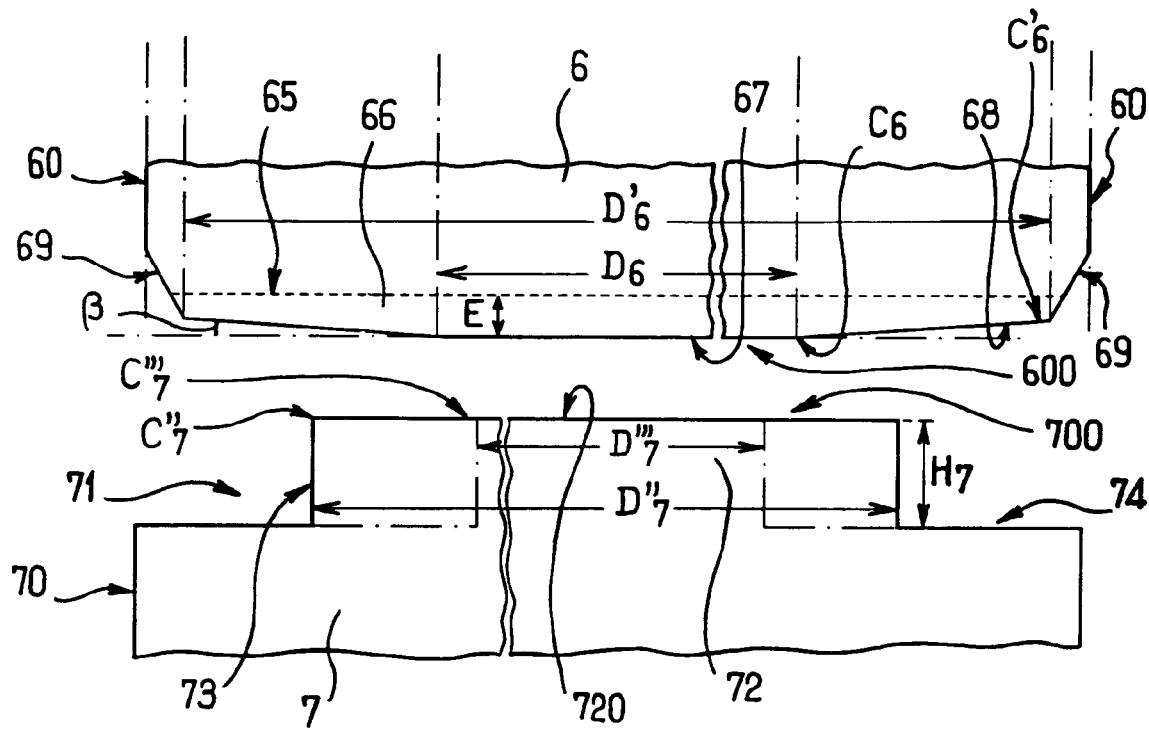
Figure 6:
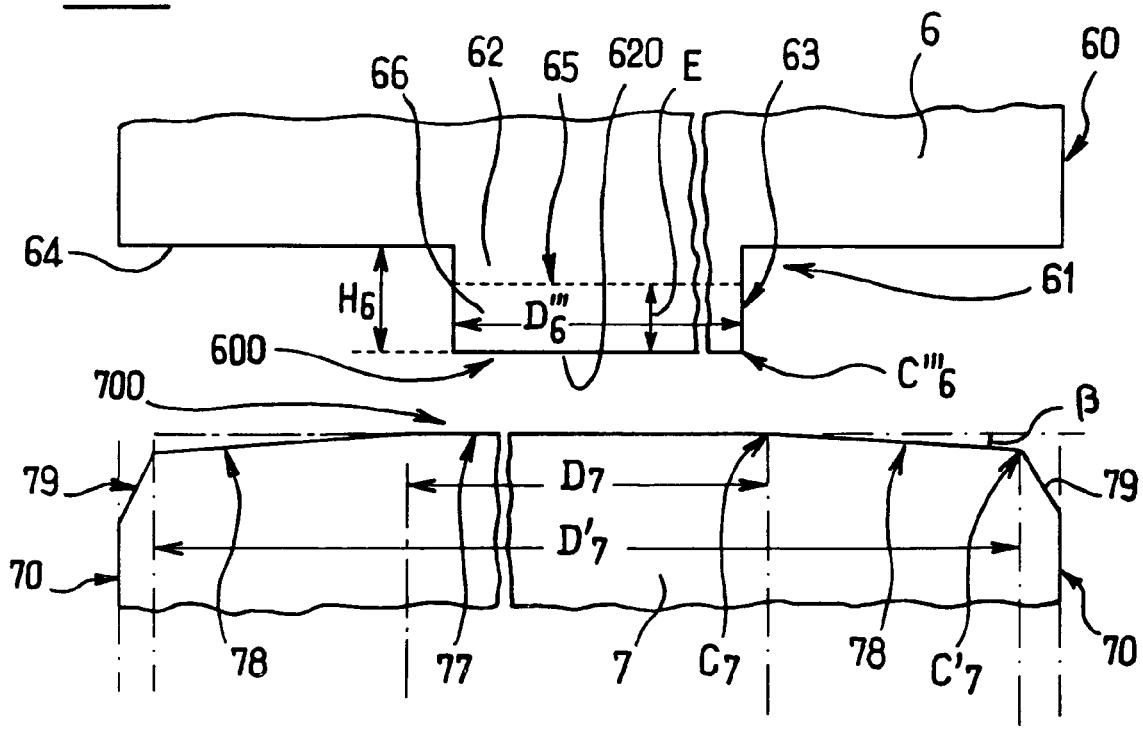
Figure 7:
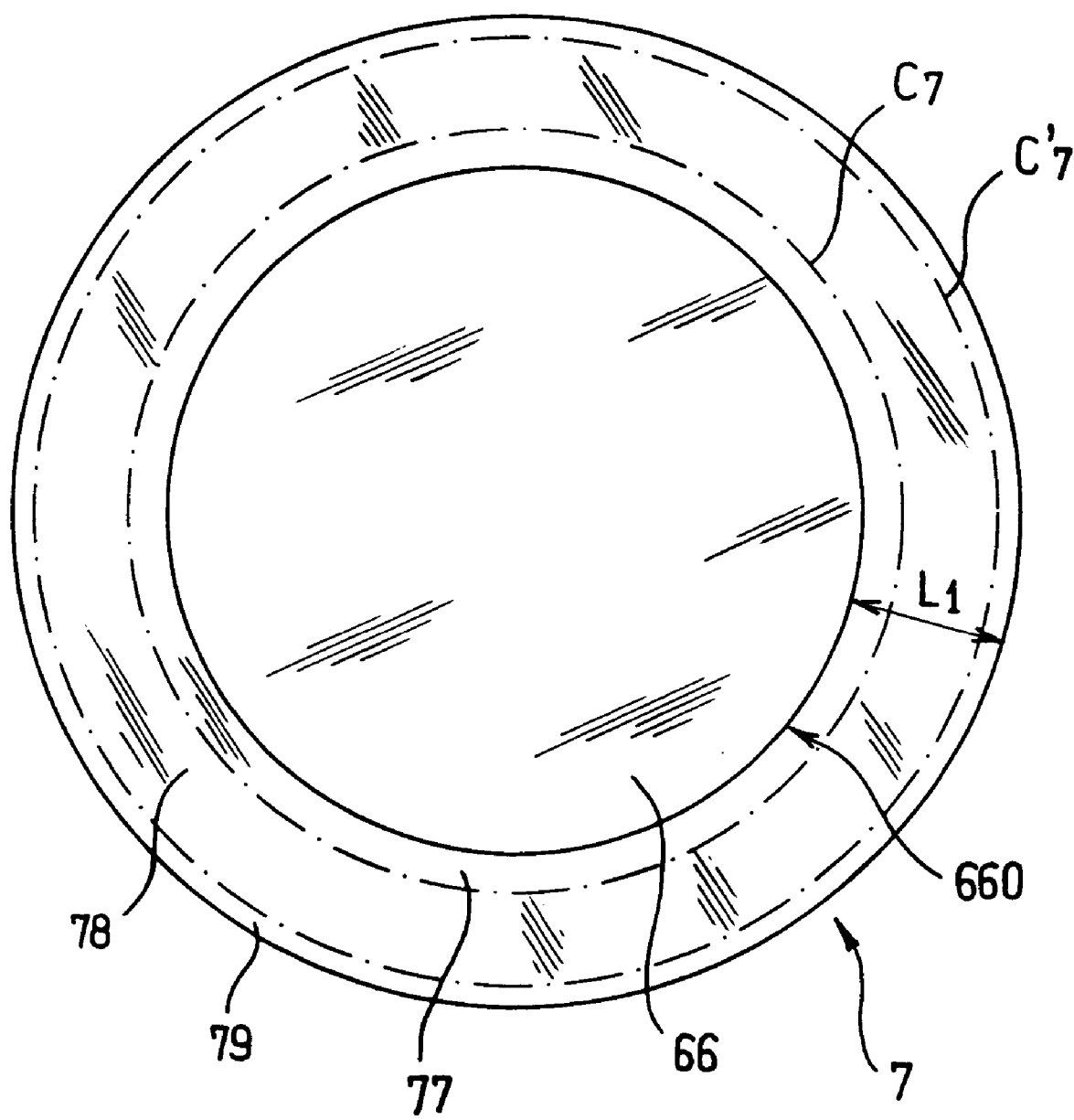

FIGS. 4, 5 and 6 are diagrams showing fragmentary vertical sections of variations of a source substrate and a support substrate ready for bonding to each other using the method according to the invention; and FIG. 7 is a diagrammatic plan view, on a different scale to the preceding figures, of a composite substrate comprising a support covered with a useful layer obtained by the method according to the invention.

DETAILED DESCRIPTION OF THE PREFERRED EMBODIMENTS

The aim of the invention is to improve methods of fabricating a composite substrate and which include at least one step of molecular bonding one of the faces of a source substrate to a facing face of a support substrate, and a step of transferring a useful layer from the source substrate onto the support substrate.

The composite substrates thus comprise at least one useful layer deriving from a source substrate transferred onto a support substrate.

According to the characteristics of the method of the invention, prior to the molecular bonding step, at least one of the faces of the source substrate or the support substrate for bonding to each other, undergoes a machining operation to form a shoulder on the face. The shoulder defines an inner (i.e., substantially central) projecting zone with a side face and with a top face that is flat or substantially flat.

During subsequent bonding, the flat top zone of the projection bonds to a zone of the facing substrate, which zone has either also been rigorously flattened, or else is spaced by only a small angle $\beta$ from the flat zone, as is described in detail below. Thus, bonding is improved.

In addition, the annular zone surrounding the projection does not come into contact with the facing substrate at all. This results in a much clearer and cleaner boundary between the facing zones of the two substrates which are bonded together and the zones which are not bonded to each other at all.

With reference now to FIG. 4, in a first implementation a projecting zone is formed only on the source substrate 6 (from which a useful layer will subsequently be removed). This generally circular source substrate 6 has a side 60.

Prior to the bonding step, the front face 600 of the source substrate 6 (i.e., the face intended to be bonded against the support substrate 7) has been machined to produce a shoulder 61 over at least a portion of its periphery and generally over all or almost all of the periphery (with the occasional exception of a zone known as a flat or notch which marks the crystallographic planes).

The shoulder 61 is advantageously produced by etching (in particular localized etching), by lapping, or by localized polishing on the side. In the case of lapping, the tool used to form the primary chamfer is adapted to the shape of the shoulder. These techniques are known to the skilled person and are not described in more detail herein.

The shoulder 61 defines an inner projecting zone 62 with a side face 63 and a top face 620. The face 620 is intended to be bonded to the face 700 of the support 7, called the "receiving face".

The face 620 is generally flat (as shown in the solid lines on FIG. 4). However, when shoulder 61 has been machined from a source substrate 6 with a secondary chamfer, the face 620 may not be rigorously flat and may have at its periphery a residue of the secondary chamfer, i.e., an annular zone 620' forming a very small angle $\beta$ with the plane of the flat central zone 620.

However, the width L" of the zone 620' is small and so with angle $\beta$ also being small, the height h corresponding to the distance at the side face 63 between the zone 620' and the plane (horizontal in the figure) of the surface 620, is also small. Thus, the surface 620 can be considered to be almost entirely flat.

The surface of the source substrate which surrounds the projecting zone 62 is termed the "setback surface" and has reference numeral 64. The face 620 (optionally including the zone 620') is termed the "top face" in contrast to this setback surface.

Throughout the description and claims, for the sake of simplicity reference is made only to the top face 620 being flat even though it may include a slightly inclined portion 620'.

Advantageously, the side face 63 is perpendicular or substantially perpendicular to the plane of the top face 620.

Preferably, but not necessarily, the source substrate 6 is in the shape of a disk, the projecting zone 62 is cylindrical, and the setback surface 64 is annular.

FIG. 5 shows a second implementation of the invention that is the opposite of that just described, in which the front face 600 of the source substrate does not have a projecting portion while the receiving face 700 of the support substrate 7 has a projecting portion. However, it should be noted that the useful layer 66 will always be removed subsequently from the source substrate 6.

In this case, and in a manner similar to that described above for the source substrate 6, the support substrate 7 has a side 70, a shoulder 71, and a setback surface 74, an inner projecting zone 72 with a side face 73 and a flat or substantially flat top face 720. The procedures for obtaining these different portions and their geometrical characteristics are identical to those described above for the source substrate 6.

It would also be possible to machine a projecting zone on the front face 600 of the source substrate 6 and simultaneously on the receiving face 700 of the support substrate 7.

It should be noted, however, that for reasons primarily concerned with the fact that the composite substrate obtained after the fabricating method (i.e., after detaching the useful layer 66), should advantageously no longer have a shoulder, the projecting zone is preferably machined on the source substrate 6.

The height of the projecting zone 62 of the source substrate 6 in FIG. 4 bears numerical reference $H_6$ while the height of the projecting zone 72 of the source substrate 7 in FIG. 5 bears reference $H_7$. Advantageously, the heights $H_6$ or $H_7$ are at least 10 nm, so as to produce a clear boundary between the top flat face 620, shown in FIG. 4 which will be bonded to the support substrate 7 and the setback surface 64 which will not bond (in FIG. 5 between the top flat surface 720 which will be bonded to the source substrate 6 and the setback surface 74, which will not adhere). In practice, during industrial fabrication, these heights $H_6$ and $H_7$ will generally be at least 200 nm.

The lateral dimensions of the projecting zones 62 and 72 can also vary, as is described below.

The useful layer can be removed from the source substrate 6 in a variety of manners which are now described.

In a first variation, prior to the step of molecular bonding substrates 6 and 7 to each other, a zone of weakness 65 is formed within the source substrate 6 to define and delimit the useful layer 66 subsequently transferred to the support 7. After bonding, the useful layer 66 is detached from the remainder of the source substrate 6 along this zone of weakness 65.

In FIGS. 4, 5 and 6, to improve clarity, the thickness of the useful layer 66 is greatly exaggerated. These figures serve only as exemplary diagrams on which substrates 6 and 7 and their geometrical outlines are not shown to scale.

Techniques for forming the zone of weakness 65 are known to the skilled person and are not all described in detail.

Advantageously, this zone of weakness 65 is formed by implanting atomic species from the front face 600.

The term "implanting atomic species" means any bombardment of atomic, molecular or ionic species, which can introduce the species into a material with a maximum concentration of the species located at a predetermined depth from the bombarded surface 600. The molecular or ionic atomic species are introduced into the material with an energy that is also distributed about a maximum.

Atomic species can be implanted into the source substrate 6 using an ion beam implanter or a plasma immersion implanter, for example. Implantation may be carried out by ionic bombardment, and the implanted ionic species may be hydrogen. Other ionic species can advantageously be used alone or in combination with hydrogen, such as rare gases (for example helium). Implantation creates the zone of weakness 65 within the bulk of the source substrate 6 and at a mean ion penetration depth, the zone being substantially parallel to the plane of the front face 600. The useful layer 66 extends from the front face 600 to this zone of weakness 65.

Reference should be made, for example to the literature concerning the method known by its registered trade mark "Smart Cut".

The zone of weakness 65 can also be constituted by a porous layer obtained, for example, using the method known by its registered trade mark "ELTRAN" from Canon, described in U.S. Pat. No. 6,100,166.

In the case shown in FIGS. 4 and 6 in which the projecting zone 62 is formed on the source substrate 6, it should be noted that the operation of machining the shoulder 61 can be carried out before or after the step of forming the zone of weakness 65. This choice can be made by the manufacturer. In practice, in a production facility, the machining operation generates dust and thus will advantageously be grouped with operations of the same nature, for example formation of the primary chamfer. In this case, the zone of weakness 65 will be formed after machining. In the case in which the zone of weakness is formed on a surface with a shoulder 61, the setback surface 64 will also have a zone of weakness.

In contrast, if the zone of weakness 65 is formed before machining the shoulder, i.e., on a substantially flat surface (ignoring the secondary chamfer zone) and the shoulder is machined afterwards (and provided that, as illustrated in FIG. 4, the height $H_6$ of the projecting portion 62 is greater than the thickness E of the useful layer 66), a zone of weakness 65 is obtained solely on the projecting portion 62, which may be advantageous. In effect, a weakened peripheral zone that may generate particles is then removed.

After the bonding step, the useful layer 66 is detached from the remainder of the source substrate 6 by at least one of the following techniques used alone or in combination: application of stresses of mechanical or electrical origin, supplying thermal energy, and chemical etching. These detachment techniques are well known to the skilled person and are not described here in any more detail. A composite substrate comprising a useful layer 66 transferred onto a support 7 is produced.

More precisely, the useful layer is detached along the zone of weakness 65. In the case illustrated in FIG. 4 or 6, the shoulder 61 is produced on the source substrate 6 if the height $H_6$ of the projecting zone 62 is greater or equal to the thickness E of the useful layer 66, and the useful layer 66 is only detached along the zone of weakness 65. If, on the other hand, E is greater than $H_6$, then the useful layer 66 is detached both along the zone of weakness 65 and above the extension of the side face 63.

Referring to FIG. 5, the shoulder 71 is formed in support substrate 7. The useful layer 66 is detached along the zone of weakness 65 and above the extension of the side face 73 of the projecting portion 72. Therefor, in this case, the outline of the transferred useful layer 66 corresponds to the diameter D"7 shown in FIG. 5, and this diameter corresponds to that portion of the front face 600 and receiving face 700 that are bonded. This operation is termed "vertical self-definition" of the useful layer 66. After detachment, an outside portion or ring of the useful layer 66 remains as residue. The residual ring represents that portion of the useful layer that was not bonded to the receiving substrate, and it must be removed from the source substrate before forming another flat front face.

Finally, in a third variation of the implementation (not shown in the figures), it is also possible to produce the useful layer 66 by the technique known as "bond and etchback" in which, after bonding the front face 600 of the source substrate 6 onto the receiving face 700 of the support substrate 7, the rear face of the source substrate 6 undergoes treatment by lapping and/or etching by chemical attack, and then polishing, until only the thickness corresponding to the useful layer 66 remains on the support 7.

In the particular case of SOI (silicon on insulator) substrates, it is possible to obtain the useful layer 66 by the BESOI method mentioned above.

Certain preferred variations of implementations are described below with regard to the dimensions and shape of the projecting zone.

Figure 1:
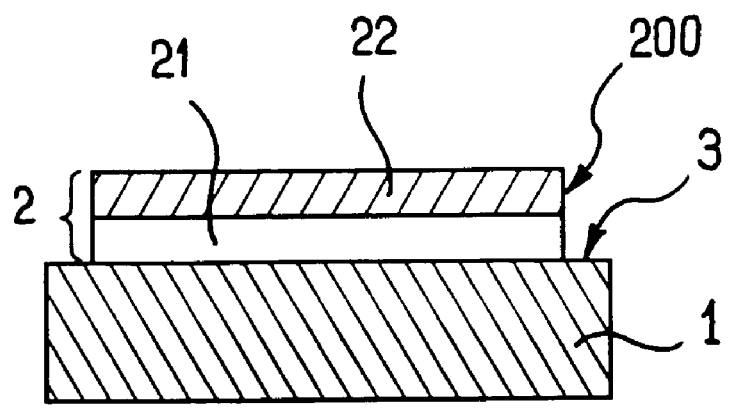
FIG. 1 is a diagram showing a conventional vertical diametrical section through an SOI type substrate.
Figure 2:
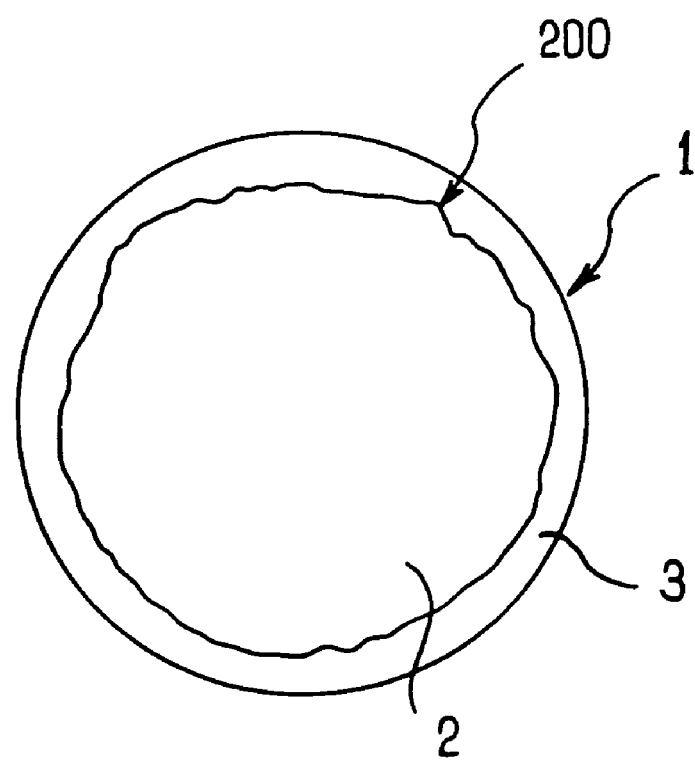
FIG. 2 is a diagram showing a plan view of the substrate of FIG. 1.
Figure 3:
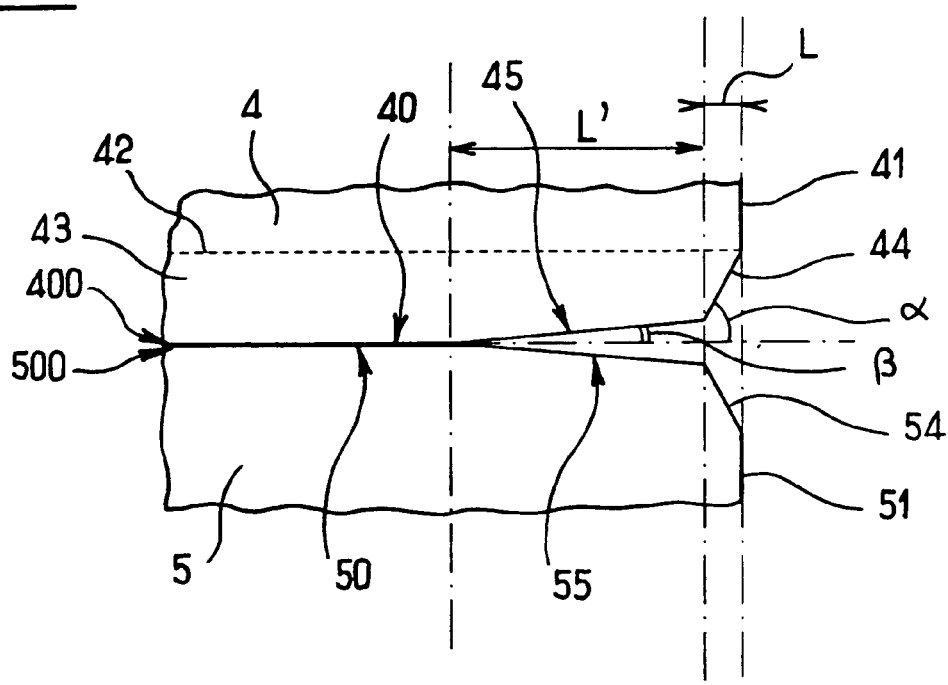
FIG. 3 is a diagram showing a fragmentary vertical section of a source substrate and a support substrate bonded together using a prior art technique.

Referring to FIG. 4, and as described above for the prior art shown in FIG. 3, it can be seen that the receiving face 700 of the support substrate 7 has a rigorously flat central zone 77 and a secondary chamfer 78. The support substrate 7 also has a primary chamfer 79.

As can be seen more easily in FIG. 7, and as is most often the case, the support substrate 7 is circular. This figure diagrammatically shows the flat central zone 77 that is also circular, and the primary chamfer 79 and secondary chamfer 78, which are substantially annular. However, as explained above, the secondary chamfer 78 is irregular and its width can vary. It should be noted that the support 7 and/or the flat central zone 77 could also be oval, octagonal or rectangular in shape, for example, and if so then the primary chamfer 79 and secondary chamfer 78 will have correspondingly different shapes.

Throughout the remainder of the description, for the purposes of simplification and as shown in the figures, the primary and secondary chamfers are assumed to be annular.

As can be seen in FIGS. 4 and 7, the secondary chamfer 78 has an inner outline $C_7$ and an outer outline $C'_7$. It should be noted that the inner outline $C_7$ of the secondary chamfer 78 also constitutes the outer outline of the flat central zone 77.

In the variation shown in FIG. 5 (and in a manner similar to that just described for FIG. 4), when the front face 600 of the source substrate 6 has no shoulder, it has a flat central zone 67, a secondary chamfer 68 and a primary chamfer 69. The secondary chamfer 68 has an inner outline $C_6$ and an outer outline $C'_6$.

The remarks made above regarding the support substrate 7 with no projection (see FIG. 4) are applicable to the source substrate 6 with no projection of FIG. 5.

The lateral dimensions of the projecting portion 62 of the source substrate 6 can vary as is described below with reference to FIGS. 4 and 6.

In a first variation shown in FIG. 4, the dimensions of the outer outline $C''_6$ of the top face 620 are less than or equal to the dimensions of the outer outline $C'_7$ of the secondary chamfer zone 78 of the support substrate 7. The area of the top face 620 is thus less than or equal to the area of the receiving face 700.

When the top face 620 and the receiving face 700 are circular, the diameter $D''_6$ of the top face 620 is less than or equal to the diameter $D'_7$ of the receiving face 700, which includes the central face 77 and the secondary chamfer 78.

Finally, the source substrate 6 is bonded to the support substrate 7 so that the outline $C''_6$ is inscribed within the outer outline $C'_7$ of the secondary chamfer zone 78.

Thus, the top face 620 of the projecting portion 62 is bonded to the central flat plane 77 and optionally to the secondary chamfer zone 78 forming an angle β with the plane of the face 620. This results in better quality bonding than in the prior art illustrated in FIG. 3 and with a fairly strong bonding energy.

In a second variation of the invention illustrated in FIG. 6, the dimensions of the outer outline $C'''_6$ of the top face 620 are less than or equal to the dimensions of the outer outline $C_7$ of the flat zone 77 of the support 7. The area of the top face 620 is thus less than or equal to the area of the flat zone 77.

When the top face 620 and the central zone 77 are circular, diameter $D'''_6$ of the top face 620 is less than or equal to the diameter $D_7$ of the flat zone 77.

Substrate 6 is bonded to the support 7 so that the outline $C'''_6$ is inscribed within the outer outline $C_7$ of the flat zone 77. This allows bonding between two rigorously flat surfaces, namely the top face 620 and the flat central zone 77 of the support 7. Bonding is further reinforced compared with the variation just described. In practice, since the width of the secondary chamfer 78 may vary, the dimensions of the shoulder 61 will be calculated to ensure that its width is genuinely greater than that of the secondary chamfer 78.

Finally, and advantageously, the source substrate 6 is bonded to the support substrate 7, so that the projecting zone 62 is centered with respect to thereto. Depending on the dimensions of this projecting zone 62, this will be centered with respect to the flat central zone 77 when the zone is small (see FIG. 6), or with respect to the secondary chamfer zone 78 when its dimensions are greater (see FIG. 4). In practice, the substrates 6 and 7 often have the same dimensions and their sides 60, 70 will be in alignment.

In a similar manner, which is therefore not described in detail, the lateral dimensions of the projecting portion 72 of the support substrate 7 can vary.

Referring now to FIG. 5, it can be seen that the dimensions of the outer outline $C''_7$ (or diameter $D''_7$) can be less than or equal to the dimensions of the outer outline $C'_6$ (or diameter $D'_6$) of the secondary chamfer zone 68 of the source substrate 6, or even (as shown in dotted lines and dot-dash lines on support 7), less than or equal to the dimensions of the outer outline $C_6$ (or diameter $D_6$) of the flat zone 67. In this case, the outline of the projecting portion 72 carries the reference $C'''_7$ (diameter $D'''_7$).

Similarly, the support 7 can be bonded against the source substrate 6 so that its projecting portion 72 is centered with respect thereto.

Regardless of the variation of the method employed, i.e., whether the shoulder is formed in the source substrate 6 or in the support substrate 7 or in both, the presence of the shoulder defines a cleaner transition between a strong bonding zone as produced between two flat or substantially flat surfaces, and a zone where bonding is absent since at least one of the two substrates 6 or 7 has a setback surface 64 or 74.

Further, outlines $C''_6$ or $C'''_6$ of the top surface 620 or the projecting portion 62 (respectively outlines $C''_7$ or $C'''_7$ of the top surface 720 of the projecting portion 72) are regular. Thus, the useful layer 66 transferred onto the support 7 has a regular outline 660 (see FIG. 7). The ring width is $L_1$.

Advantageously, and in the case shown in FIGS. 4 and 6 where shoulder 61 is formed in the source substrate 6, the height $H_6$ of the projecting zone 62 is greater than or equal to the thickness E of the useful layer 66. By way of example, this thickness E can be from 100 angstroms (Å) to a few micrometers.

During detachment, the transferred useful layer 66 has the dimensions and outline shape $C''_6$ of the projecting zone 62.

In a further advantageous variation of the invention, when the useful layer 66 is defined by the existence of a zone of weakness 65, it is possible to begin by machining once only, a shoulder 61 of a height $H_6$ that is sufficiently large, i.e., substantially greater than E, and then to be able to carry out at least one cycle of operations:

forming a zone of weakness 65 within the projecting zone 62;

molecular bonding the top face 620 onto the receiving face 700 of the support substrate 7 as described above; then detaching the useful layer 66 from the remainder of the source substrate 7 along the zone of weakness 65.

This operation can be repeated so long as height $H_6$ allows a useful layer 66 of the selected thickness E to be transferred. By way of example, in this case, the value of $H_6$ is at least 2000 nm, or even several tens of micrometers.

Advantageously, a finishing step can be carried out on the top face 620 of the projecting zone 62 before forming the zone of weakness 65.

However, clearly there is no impediment to forming the shoulder 61 and the zone of weakness 65 at each step of transferring a useful layer 66.

Finally, examples of materials to which the method can be applied are given.

The support substrate 7 is formed from a material that is optionally a semiconductor and that may be selected, for example, from: silicon; a transparent substrate (such as quartz or glass, for example); silicon carbide; gallium arsenide; indium phosphide; or germanium.

The source substrate 6 maybe formed from a semiconductor material selected, for example, from: silicon; germanium; silicon carbide; silicon and germanium alloys or "compounds" (known as "Si—Ge compounds"); alloys or compounds known as "III/V compounds", i.e., compounds one element of which is from column IIIa of the periodic table and the other is from column Va, such as gallium nitride; gallium arsenide; or indium phosphide.

Finally, it should be noted that it is possible to cover the receiving face 700 of the support 7 with an insulating layer of the oxide type (for example $SiO_2$) or of the nitride type (for example $Si_3N_4$). This insulating layer may then being interposed between the useful layer 66 and the support 7, after detaching the layer 66.

It is possible to cover the front face 600 of the source substrate 6 with an insulating material of the type mentioned above. The transferred useful layer 66 then includes two layers.

In this case, the insulating material is deposited before or after forming the projecting zone 62.

It is also possible to deposit a plurality of layers onto the source substrate 6 and the term "useful layer" then designates a stack of layers.

What is claimed is:

1. A method of providing a regular outline in a useful layer of material that is transferred from a source substrate onto a support substrate during the fabrication of a composite substrate for subsequent use in electronics, optics, or opto-electronics, which comprises:

providing a shoulder on a front face of one of the source or support substrates about its periphery, wherein the shoulder defines an inner projecting zone that has a top face, a sidewall and a regular outline;

molecularly bonding the top face of the projecting zone to a receiving face of the other of the source or support substrates, wherein the receiving face is bordered by a primary chamfer zone, a secondary chamfer zone, and a central zone having a flatness suitable for facilitating molecular bonding; and removing a portion of the source substrate to provide the useful layer having the regular outline on the support substrate.

2. The method of claim 1 wherein the shoulder is provided on the support substrate and the top face of the projecting zone is molecularly bonded to the receiving face of the source substrate.

3. The method of claim 1 wherein the shoulder is provided on the front face of the source substrate, the shoulder including the useful layer that is to be transferred, and the top face of the projecting zone is molecularly bonded to the receiving face of the support substrate.

4. The method according to claim 1 wherein the shoulder is provided by machining or etching the periphery of the front face of the substrate.

5. The method of claim 1 wherein the outline of the top face of the projection zone has a periphery that is smaller than the inner periphery of the secondary chamfer zone so that, when bonded to the receiving face, the top face does not contact the secondary chamfer zone.

6. The method according to claim 1 wherein the sidewall of the projecting zone is substantially perpendicular to the top face.

7. The method according to claim 1 which further comprises, prior to the bonding step, forming a zone of weakness within the source substrate.

8. The method according to claim 7 wherein the useful layer extends between the zone of weakness and the face of the source substrate, and after the bonding step, the method further comprises detaching the useful layer from the remainder of the source substrate along the zone of weakness.

9. The method according to claim 8 wherein the useful layer is detached by at least one of applying stresses of mechanical or electrical origin, supplying thermal energy, or chemical etching.

10. The method according to claim 8 wherein the zone of weakness is formed by atomic species implantation or by a porous layer.

11. The method according to claim 8 wherein the shoulder is provided on the front face of the source substrate prior to forming the zone of weakness.

12. The method according to claim 11 wherein the height of the projecting zone of the source substrate is greater than or equal to the thickness of the useful layer.

13. The method according to claim 1 wherein the height of the projecting zone is 10 nm to 200 nm or more.

14. The method according to claim 1 which further comprises polishing an exposed face of useful layer after detachment from the source substrate.

15. The method according to claim 1 wherein the support substrate is produced from silicon; silicon carbide; gallium arsenide; indium phosphide; or germanium.

16. The method according to claim 1 wherein the source substrate is formed from a semiconductor material.

17. The method according to claim 16 wherein the semiconductor material of the source substrate is silicon; germanium; compounds of silicon and germanium; silicon carbide; gallium nitride; gallium arsenide; or indium phosphide.

18. The method according to claim 1 wherein at least one of the molecularly bonded faces includes a layer of an insulating material.

19. The method according to claim 1 wherein the molecularly bonded face of the source substrate includes a layer of an insulating material.

* * * * *